United States Patent [19]

Yap

[11] Patent Number: 5,492,607
[45] Date of Patent: Feb. 20, 1996

[54] METHOD OF FABRICATING A SURFACE EMITTING LASER WITH LARGE AREA DEFLECTING MIRROR

[75] Inventor: Daniel Yap, Thousand Oaks, Calif.

[73] Assignee: Hughes Aircraft Company, Los Angeles, Calif.

[21] Appl. No.: 18,845

[22] Filed: Feb. 17, 1993

[51] Int. Cl.$^6$ .................... C23C 14/36; H01L 21/306; H01L 21/20; C03C 25/02
[52] U.S. Cl. .................. 204/192.34; 216/66; 156/643.1; 427/162; 427/163.2; 437/129; 204/192.35
[58] Field of Search .................... 204/192.34, 192.35; 156/643, 655, 659.1, 662, 643.1, 655.1, 659.11, 662.1; 427/162, 163.2, 255.2; 437/129; 372/45, 48

[56] References Cited

U.S. PATENT DOCUMENTS 4,784,722  11/1988  Liau et al. ............................ 156/655.1
4,869,780  9/1989  Yang et al. ......................... 204/192.34

FOREIGN PATENT DOCUMENTS 3138704  4/1983  Germany ............................... 437/129

OTHER PUBLICATIONS

Vogel IBM Technical Disclosure Bulletin vol. 21 No. 3 Aug. 1978; p. 1218 "Photolithographic Mask Structured to Remove Redeposited Material After Ion Milling or Sputter Etching".
Tell et al., "High–power cw vertical–cavity top surface–emitting GaAs Quantum Well Lasers", *Applied Physics Letters*, vol. 57, No. 18, 29 Oct. 1990, pp. 1855–1857.
Itaya et al., "New 1.5 Micron Wavelength GaInAsP/InP Distributed Feedback Laser" *Electronics Letters*, vol. 18, No. 23, 1982, pp. 1006–1007.

Ng et al., "Highly collimated broadside emission from room temperature GaAs distributed Bragg reflector lasers", *Applied Physics Letters*, vol. 31, No. 9, 1 Nov. 1977, pp. 613–615.
SpringThorpe, "A novel double–heterostructure p–n–junction laser", *Applied Physics Letters*, vol. 31, No. 8, 15 Oct. 1977, pp. 524–525.
Goodhue et al., "Monolithic Two–Dimensional GaAs/AlGaAs Laser Arrays Fabricated by Chlorine Ion–Beam–Assisted Micromachine", *Journal of Electronic Materials*, vol. 19, No. 5, 1990, pp. 463, 469.
Liau et al., "GaInAsP/InP buried heterostructure surface–emitting diode laser with monolithic integrating bifocal microlens", *Applied Physics Letters*, vol. 56, No. 13, 26 Mar. 1990, pp. 1219–1221.
Liau et al., "Surface Emitting GaInAsP/InP Laser with low Threshold Current and High Efficiency", *Applied Physics Letters*, vol. 46, No. 2, 15 Jan. 1985, pp. 115–117.

*Primary Examiner*—R. Bruce Breneman
*Assistant Examiner*—Rodney G. McDonald
*Attorney, Agent, or Firm*—Vijayalakshmi D. Duraiswamy; Wanda K. Denson-Low

[57] ABSTRACT

A surface-emitting laser system includes a laser that emits a vertically divergent beam generally parallel to the substrate on which it is formed, and a turning mirror in the path of the beam that extends up from the substrate to a level well above the laser height. The extended mirror area reflects a greater portion of the beam than prior planar designs, increasing the output efficiency and providing a smoother beam pattern. One fabrication method employs a masking and ion beam milling technique that uses an accumulation of redeposited material to form the additional mirror area, with a thick mask layer that is later removed guiding the redeposition. An alternate fabrication method involves epitaxial growth of an additional layer of material above the conventional laser epilayers, with the additional layer subsequently removed from the laser region but retained in the mirror region.

12 Claims, 2 Drawing Sheets

METHOD OF FABRICATING A SURFACE EMITTING LASER WITH LARGE AREA DEFLECTING MIRROR

BACKGROUND OF THE INVENTION

1. Field of the Invention

This invention relates to laser systems and associated fabrication methods for directing a laser beam away from a substrate, and more particularly to the use of an external turning mirror to redirect an in-line beam from a monolithically fabricated laser away from its substrate.

2. Description of the Related Art

Ultra-high speed interconnect links between integrated circuit (IC) chips and data busses are needed for 3-dimensional optoelectronic systems. Currently available electronic systems incorporate optical isolation and optical data paths between larger subsystems, but the optical elements are discrete. A more compact, less expensive and more reliable system would result if the optical elements could be monolithically integrated on the same chip substrates as the electronic circuitry as surface emitting (optical output directed away from the substrate surface) elements. Applications for such 3-D interconnects include computers and processors, optical displays, optical signal processing and computing, intersatellite communication, the pumping of solid state crystals, and visual displays.

Three approaches have been developed to achieve out-of-plane laser emissions:

(1) Vertical cavity lasers, in which the laser beam is initially emitted vertically upward and away from the substrate upon which the laser is formed. This type of laser is described in Tell et al., "High-power cw vertical-cavity top surface-emitting GaAs Quantum Well Lasers", *Applied Physics Letters*, Vol. 57, No. 18, 29 Oct. 1990, pages 1855–1857. They have very short optical cavities, on the order of an optical wavelength, and require high reflecting mirrors, typically using epitaxially grown Bragg reflectors for the mirrors. However, such lasers exhibit poor efficiency and high electrical resistance. Also, it is difficult to produce high reflectivity semiconductor quarter wavelength Bragg mirrors, due to the low index of refraction modulation in such mirrors.

(2) A periodic grating on the laser's upper cladding layer to couple light vertically out of the laser plane. See, for example, Itaya et al., "New 1.5 Micron Wavelength. GaInAsP/InP Distributed Feedback Laser", *Electronics Letters*, Vol. 18, No. 23, 1982, pages 1006–1007, and Ng et al., "Highly collimated broadside emission from room temperature GaAs distributed Bragg reflector lasers", *Applied Physics Letters*, Vol. 31, No. 9, 1 Nov. 1977, pages 613–615. Unfortunately, lasers of this type suffer from having extremely elliptical output beams and they require long sections of the grating, which increases the device size.

(3) In-plane surface emitting lasers, in which a laser beam is initially generated generally parallel to the substrate, and then deflected by a turning mirror so that the beam travels away from the substrate. The turning mirror can either be part of the laser cavity (a "folded-cavity" laser), or external to the laser.

An early folded-cavity laser contained a 45° surface that was etched into the topside of the wafer to deflect light into the substrate; SpringThorpe, "A novel double-heterostructure p-n-junction laser", *Applied Physics Letters*, Vol. 31, No. 8, 15 Oct. 1977, pages 524–525. A disadvantage of this type of laser is that it must be made on a transparent substrate material, or have a deep via etched into the substrate. In addition, the device must be mounted top-side down, and thus is not readily integrated with electronic circuits, whose connections are typically formed by wire bonding to the top surface. Folded-cavity lasers with an emission from the top surface have also been demonstrated. The 45° mirror of such lasers is made by dry-etching a slot into the top surface, which involves a more complicated procedure. See Goodhue et al., "Monolithic Two-Dimensional GaAs/AlGaAs Laser Arrays Fabricated by Chlorine Ion-Beam-Assisted Micromachine", *Journal of Electronic Materials*, Vol. 19, No. 5, 1990, pages 463–469.

Surface-emitted beams with good far-field patterns have been produced with folded-cavity lasers, since it is possible to form an integrated lens on the emitting surface of the device to collimate or focus the output beam. However, the design and fabrication of this lens is very complicated, since it must perform the dual functions of cavity reflection and beam shaping; see Liau et al., "GaInAsP/InP buried heterostructure surface-emitting diode laser with monolithic integrating bifocal microlens" *Applied Physics Letters*, Vol. 56, No. 13, 26 March 1990, pages 1219–1221.

Most surface emitting lasers incorporate external-cavity turning mirrors that are spaced from one or both ends of the laser cavity. Such a device is shown in Liau et al., "Surface Emitting GaInAsP/InP Laser with Low Threshold Current and High Efficiency", *Applied Physics Letters*, Vol. 46, No. 2, 15 Jan. 1985, pages 115–117. These lasers are fabricated by growing a conventional (parallel to the substrate) in-line laser structure, and then forming the vertical cavity mirrors and a 45° tilted deflecting mirror that is opposite one of the cavity mirrors. A common method is to form both the cavity mirror and the turning mirror at one end of the cavity by ion-beam milling, with the wafer surface inclined away from normal to the incident beam direction (see Goodhue et al., cited above). The turning mirror can be provided with a curved surface to collimate or focus the beam which it deflects. A second milling step may be used to form the mirrors at the opposite end of the cavity, if desired. Since the laser cavity is similar to that of edge-emitting lasers, the device's performance is likewise as good as that of edge emitting lasers in most respects. However, these lasers suffer from a distorted far-field pattern and reduced output efficiency.

FIG. 1 shows a conventional horizontal cavity surface emitting laser system. A laser 2 extends upward from a semiconductor substrate 4, with an active lasing layer 6 sandwiched between upper and lower semiconductor cladding layers 8 and 10; the body of the substrate can itself serve as the lower cladding layer. The laser's rear surface 12 is coated with a fully reflective mirror (not shown), while an angled trench 14 is formed immediately in front of the laser to permit the deposition of a partially reflective mirror (not shown) over the front end 16 of the laser. The trench wall 18 opposite the laser is formed at an angle, typically 45°, that causes at least part of the emitted laser beam 20 to be deflected generally perpendicular to the substrate.

The laser's active (light emitting) layer 6 is typically located between 1 and 2 microns below the device's upper surface. Since the vertical height of the active layer is quite small, on the order of 0.1 micron, the out-put beam 20 (indicated by dashed lines) has an appreciable vertical divergence or "fanning". The beam will in general diverge vertically beyond the mirror surface 18, with as much as 20%–40% of the beam (indicated by shaded region 22)

passing above the mirror and not being deflected along with the rest of the beam. This optical loss reduces the laser's efficiency, and distorts the resultant beam pattern. Interference effects from the light hitting the edges of the turning mirror also produce unwanted ripples or side lobes in the far-field pattern.

SUMMARY OF THE INVENTION

The present invention :seeks to provide an external cavity surface emitting laser that improves upon both the efficiency and optical quality of prior devices by deflecting a substantially greater portion of the laser beam into the ultimate output from the device, along with special fabrication techniques to obtain the new laser structure.

These goals are accomplished by fabricating an external turning mirror on the same substrate with an in-line laser, with the mirror including both a portion that is generally in-line with the laser and an extension that extends beyond the upper laser surface to deflect the portion of the laser beam that would otherwise be lost to the system. To this end the height of the mirror extension above the laser can be comparable to the vertical height of the laser itself.

One fabrication technique for the new structure involves the use of a novel masking and ion beam milling technique that uses an accumulation of redeposited material to form the mirror extension. A thick masking layer, which is later removed, is used to both pattern the base portion of the mirror and to provide a backing for the accumulation of redeposited material into a mirror extension. For a laser height of about 3–6 microns, the etch mask is preferably formed as a photoresist which extends about 5–10 microns above the substrate prior to the ion beam milling, and is reduced to a height of about 3–6 microns by the milling process. An opening is patterned in the photoresist to expose the substrate over the mirror area, including a setback to allow for the accumulation of the redeposited etched material which forms the mirror extension.

In an alternate fabrication method, a mirror extension layer is first formed over the substrate, and an angled opening is then etched into both the extension layer and the underlying active and cladding layers. This opening defines both the emitting edge of the laser and an opposed turning mirror which extends above the upper laser surface. The extension layer is then removed from over the laser. Epitaxial growth methods can be used to form the extension layer, with an etch stop layer provided immediately below the extension layer to assist in removing the extension layer from over the laser. The etch stop layer is then itself removed from over the laser, but remains in place within the mirror. Mirror and etch stop materials with similar refractive indices are selected to prevent optical distortions from the residual etch stop layer. In removing the extension layer from over the laser, protection of the laser emitting edge is assured by having a mirror mask overlap several microns onto the upper laser surface.

The fabrication methods involved require only conventional processing equipment, and are compatible with lasers made from various materials. These and further features and advantages of the invention will be apparent to those skilled in the art from the following detailed description, taken together with the accompanying drawings.

BRIEF DESCRIPTION OF THE DRAWINGS

FIGS. 5a1–5d are sectional views showing successive steps in the formation of a laser-mirror structure with an alternate fabrication technique provided by the invention;

DETAILED DESCRIPTION OF THE INVENTION

Figure 1:
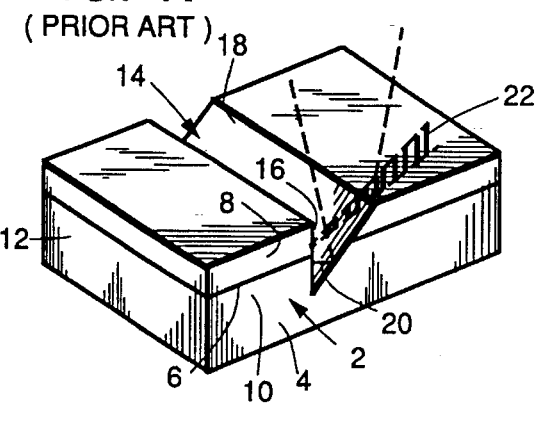
FIG. 1 is a perspective view, described above, of a prior surface emitting laser with an external deflecting mirror.
Figure 2:
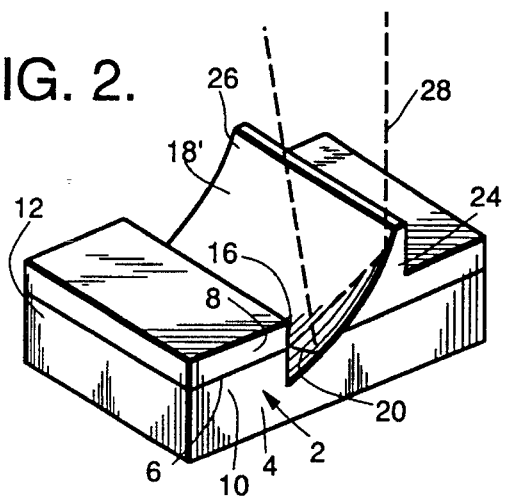
FIG. 2 is a perspective view of a laser and turning mirror structure in accordance with the invention.

A surface-emitting laser system that illustrates the invention is shown in FIG. 2, with elements that are the same as in the prior art device of FIG. 1 indicated by the same reference numerals. One of the advantages of the invention is that it is compatible with various material systems for the laser 2, such as InP cladding layers and substrate with an InGaAs active region, or GaAs-based materials. It can also be monolithically integrated on the same substrate with electronic circuitry. However, instead of the upper edges of the laser and turning mirror being co-planar, an upward extension 24 is added to the mirror structure. The mirror thus comprises a lower section 18' that is aligned with the laser as in the prior device, and also an extended surface 26 that rises above the level of the laser's upper surface. If the extension is made high enough to accommodate the laser beam's vertical divergence from its nominal axis, which is generally parallel to the substrate, substantially the entire beam can be deflected and included in the out-of-plane output beam 28. The extended mirror can be curved, as shown, to collimate or focus the beam as desired. The new structure is preferably fabricated from a standard laser epilayer wafer, similar to conventional devices.

Figure 3A:
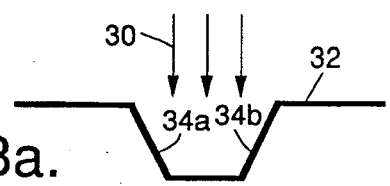
FIGS. 3a and 3b are diagrams illustrating the angled ion milling technique used in the preferred embodiment of the invention.
Figure 3B:
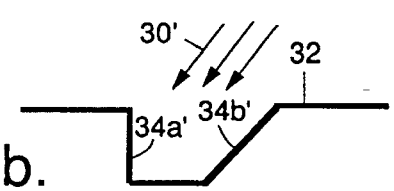

Two fabrication methods for the new laser-turning mirror structure are described below. The preferred implementation for both methods employs directional ion beam milling to form both a vertical or near-vertical laser emitting face 16, and the angled turning mirror. The manner in which an ion beam that is directed at a single fixed angle can produce a pair of opposed etched surfaces at two different angles is illustrated in FIGS. 3a and 3b. In FIG. 3a an ion beam 30 is shown directed vertically downward against the horizontal upper surface of a substrate 32. The etching proceeds laterally as well as vertically downward, producing sloped sidewalls 34a and 34b at an angle to vertical, rather than parallel to the beam. Depending upon the characteristics of the beam and of the substrate material, the beam can be tilted to a particular off-vertical angle such that one of the sidewalls is vertical, while the other sidewall is offset from vertical by a greater angle than the beam. This is illustrated in FIG. 3b, in which the beam 32' is now at an angle to vertical, resulting in the sidewall 34a'being vertical and the opposed sidewall 34b'having a greater angle to vertical than in FIG. 3a. For the laser-turning mirror fabrication methods described below, in which an InP substrate with an InGaAs active layer was used, a vertical laser emitting surface and a 45° tilted mirror surface were obtained concurrently with a 500 eV argon ion beam at a 30° angle to vertical (the term "vertical" is arbitrary and is used for ease of description; it actually refers to a direction normal to the substrate surface, regardless of the substrate orientation). Other inclination angles may be necessary for beams at other energies or having other ion constituents, such as chlorine.

Figure 4A:
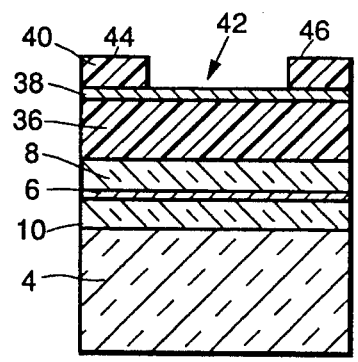
FIGS. 4a–4d are sectional views that show successive steps in the formation of the laser mirror structure in accordance with one fabrication technique provided by the invention.
Figure 4B:
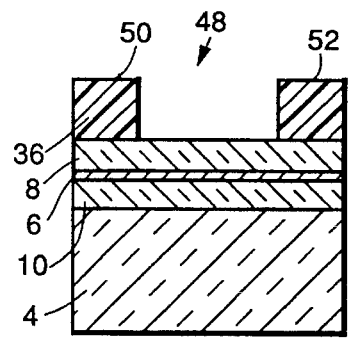

The first fabrication method is illustrated in FIGS. 4a–4d. Assuming a total thickness of about 3–6 microns for the laser cladding layers 8 and 10 and the active region 6, a first etch mask 36, preferably a photoresist, is formed over the upper cladding layer 8, preferably to a thickness of about 5–10 microns. An interlayer 38 of a material such as titanium is formed over the first photoresist layer 36, followed by an upper mask layer 40, preferably also photoresist. The upper photoresist layer 40 is patterned by conventional photolithography techniques to establish an opening 42 over the intended area for both the aligned and extended portions of the mirror. Other mask materials, such as a polyimide for the lower mask 36 and a silicon dioxide for the interlayer 38, could also be used. The upper photoresist layer 40 acts as a mask for reactive ion etching (RIE) of the underlying exposed titanium, which is preferably removed by etching with a fluorocarbon gas. This removes the titanium layer from the area between the upper photoresist posts 44 and 46 on opposite sides of the patterned opening 42. The remaining titanium below the posts 44 and 46 then serves as a mask for RIE of the lower photoresist layer 36, which is preferably accomplished with oxygen. The photoresist etch removes the portion of the first photoresist layer 36 below the opening 42, and also the posts 44 and 46 from the upper photoresist layer. Finally, the remaining titanium layer is removed by etching in hydrofluoric acid. The result is shown in FIG. 4b, in which an opening 48 is left in the lower photoresist layer 36, with photoresist posts 50 and 52 bounding the opening on its opposite sides. By adjusting the RIE conditions, the width and sidewall profile of the opening 48 formed in the lower photoresist layer can be varied as desired.

Figure 4C:
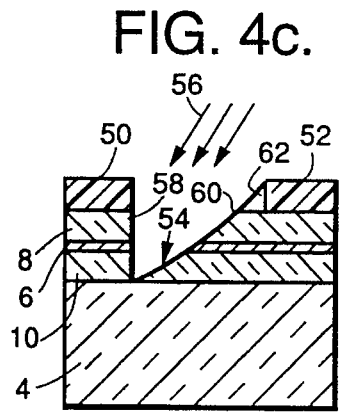

The photoresist posts 50 and 52 serve as a mask for ion beam milling of a deep beveled groove 54 through the upper and lower cladding layers 8 and 10 and the intervening active layer 6, as shown in FIG. 4c. The preferred parameters for the ion beam 56 are described above, and result in a vertical (or near vertical) laser emitting surface 58 on one side of the groove 54, and a mirror surface 60 on the other side of the groove that is tilted at an angle of about 45° to vertical as shown in FIG. 4c.

During the ion beam milling process, cladding material (along with a small portion of active layer material) that is sputtered by the applied ions redeposits and accumulates as a mirror extension 62 in the corner formed by the upper surface of the laser epilayers and the edge of the photoresist post 52, as shown in FIG 4c. This post 52 shades the redeposition area during the ion beam milling process, allowing the redeposited material to accumulate there. For the beam conditions described above and a total laser thickness of about 3–6 microns, forming the initial photoresist posts 50 and 52 (FIG. 4b) with heights of about 5–10 microns will leave the post heights at about 3–6 microns after the etching has been completed, since the etchant preferably attacks the laser material but also attacks the photoresist to a lesser degree. A desired curvature can be established for the nominally 45° tilted mirror surface by adjusting the initial width and shape of the photoresist opening 48, and also the thickness of the photoresist posts 50 and 52.

The successful redeposition of a mirror extension 62 depends primarily upon the height of the photoresist posts 50, 52 and the distance between them, the type of photoresist used, the depth of the etch, and the ion beam angle. The ion beam angle can be adjusted if necessary to obtain proper redeposition. While such adjustment can effect the angle of the laser's emitting surface 58, there is normally about a 2° tolerance from absolute vertical for this surface. If the width of the etch is substantially greater than the etching depth, a flat rather than a curved mirror surface can result. While this might be desirable in some instances, such as when further processing of the mirror surface with a focused ion beam (FIB) is performed to obtain a precise mirror curvature, it is normally desirable to establish a mirror curvature that is concave with respect to the laser to limit the beam divergence.

Figure 4D:
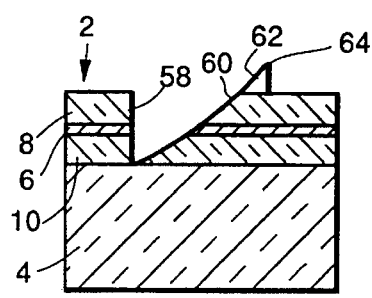

After the ion milling has been completed, the remaining photoresist posts 50 and 52 are removed with an appropriate solvent, leaving a mirror that includes both the section 60 that is horizontally aligned with the laser 2, and the redeposited mirror extension 62 that projects above the upper laser surface, as shown in FIG. 4d. The mirror extension 62 is generally triangular in shape, reaching an apex 64 at its point of maximum height above the substrate, and generally expanding in width as it approaches the laser level.

To increase the surface emitted light output, the mirror surfaces 60 and 62 can be coated with a highly reflective surface by evaporating a layer of metal onto the upper side of the substrate. The substrate is mounted at an angle to the evaporation during this process, approximately 30° so that the laser emitting surface 58 is shadowed and not covered with the metal. The metal may be additionally patterned using conventional lift-off lithography techniques. Also, the laser-emitting surface 58 may be covered with an antireflection coating by conventional plasma-enhanced chemical vapor deposition (CVD) of silicon nitride. A fully or partially reflective coating can also be applied to the opposite laser face to complete the resonating cavity.

Other laser processing steps depend upon the specific type of laser to be fabricated (such as ridge-waveguide or buried heterostructure). Such steps can be performed either before or after the turning mirror fabrication, and are conventional for laser fabrication. The mirror fabrication technique itself only requires the use of commonly found processing equipment, such as reactive-ion etchers, ion beam millers and evaporators.

A second fabrication technique is illustrated in FIGS. 5a–5d. Again, elements that are the same as those described previously are identified by the same reference numerals. In this embodiment standard laser epilayers are grown, followed by the growth of an etch-stop layer 66 over the upper cladding layer 8, and then a thick upper epitaxial extension layer 68. Depending upon the particular material system, the epitaxial layer 68 can be either the same material or a different material from the upper cladding layer 8. For example, with GaAs lasers the upper cladding layer is AlGaAs and the epitaxial layer 68 is preferably GaAs, while with InP lasers both the upper cladding and epitaxial layers are InP.

Figure 5A:
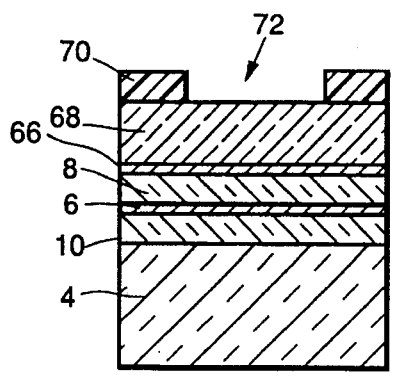

The etch stop layer 66 and upper epitaxial layer 68 should have refractive indices that are similar to those of the laser cladding layers to minimize optical distortion in the final turning mirror, unless that mirror is further covered with a highly reflective layer. For a GaAs-based laser, for example, the etch stop layer 66 may comprise GaAlAs, with the upper epitaxial layer 68 formed from GaAs. Various epitaxial growth techniques can be used, such as metal organic vapor phase epitaxial or molecular beam epitaxy. Following the growth of these layers, a mask layer 70 is deposited on the wafer and patterned with a mirror opening 72, as shown in FIG. 5a.

Figure 5B:
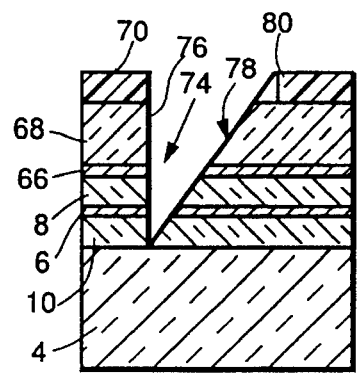

In the next step, illustrated in FIG. 5b, a beveled groove 74 is etched into the wafer by a technique such as ion beam milling. One groove wall 76 is vertical to establish the laser emitting surface, while the opposed groove wall 78 is tilted at about 45° to vertical to form the mirror surface. The ion beam milling technique can be similar to that used for etching the mirror groove of a conventional external cavity 45° mirror laser. Since a deep groove is required if the mirror is to extend all the way to the bottom of the laser, the mask layer 70 must be capable of withstanding a prolonged etching. Examples of appropriate mask materials are a thick layer of photoresist for argon ion beam milling, or a thick layer of nickel for chlorine RIE. A section of redeposited material 80 will generally be formed in the shadow of the ion beam mask 70, as with the fabrication method of FIGS. 4a–4d. Since the primary mirror extension is provided by the upper epitaxial layer 68, this additional section 80 can either be left in place or removed; it is accordingly indicated in dashed lines in the subsequent figures.

Figure 5C:
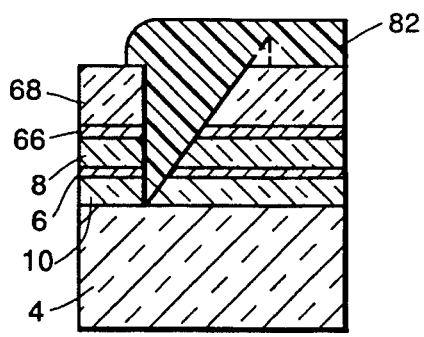
Figure 5D:
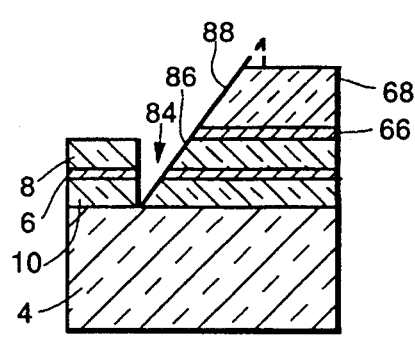

After the mirror region has been etched, the mask material 70 is removed by a solvent or a chemical etchant. The wafer is then covered with a layer of photoresist 82, which is patterned so that it covers only the vicinity of the mirror groove, as shown in FIG. 5c. To protect the laser's emitting surface during a subsequent etch step, the photoresist should fill the entire groove. To ensure that this has occurred, the photoresist is patterned so that it extends over the upper epitaxial layer 68 above the laser area by several microns. The wafer is next subjected to a selective RIE, plasma etching or wet chemical etching that removes the upper epitaxial layer 68 from the exposed region overlying the laser; the etching extends laterally as well as vertically downward, thereby undercutting the overlapping photoresist and removing all of the upper epitaxial layer from above the laser. The selective etchant, which for GaAs could be a $CCl_2F_2$ plasma, does not attack the underlying etch stop layer 66, which protects the laser itself. The etch stop layer is then removed by another selective etchant, such as hydrofluoric acid for GaAlAs, that does not attack the laser epilayers below. This is followed by a removal of the photoresist mask 82 to complete the fabrication of the cavity mirror as shown in FIG. 5d.

The remaining steps for fabricating the laser, such as the definition of the laser stripe and the electrical contacts, can be accomplished using standard techniques. As with the embodiment of FIGS. 4a–4d, the mirror surface can be provided with a highly reflective coating and the vertical laser emission surface with an anti-reflection coating to increase the system's optical output intensity.

The final device structure includes a finished laser 84, a lower mirror section 86 that is aligned with the laser, and an upper mirror extension 88 that extends generally parallel to the substrate and laser and includes a mirror surface that generally faces the laser. The provision of a reflective coating on the mirror surface would also prevent the etch stop layer 66 from distorting the reflected beam.

With either fabrication method, the turning mirror extends far enough above the upper laser surface to ensure that substantially all of the light emitted from the laser is reflected into the ultimate output beam. Although the turning mirror illustrated in FIG. 5d is shown with a flat surface, in practice it would normally also have a concave curvature relative to the laser, as with the mirror of FIG. 4d. This curvature tends to focus the beam with respect to its vertical divergence when first emitted from the laser. For narrow stripe lasers, such as single transverse-mode devices, it may be desirable to also focus or collimate the beam in a horizontal plane.

Figure 6:
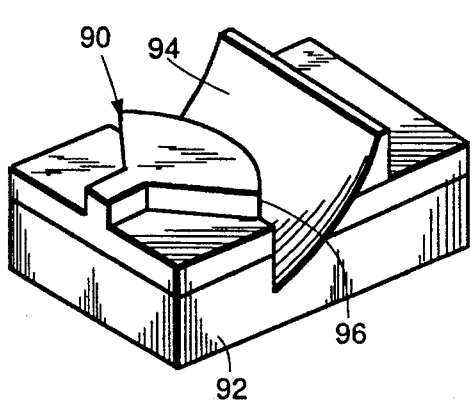
FIG. 6 is a perspective view of a laser-mirror structure of the invention with a curved laser emission surface.

Several techniques for shaping the beam in a horizontal plane have been developed previously for edge emitting lasers, and could be incorporated into the present surface emitting laser for this purpose. The resultant structure for a ridge-waveguide laser 90 is illustrated in FIG. 6. The laser is fabricated on a substrate 92, and a turning mirror 94 with an upper extension is provided as described above. A region 96 is provided at the end of the laser cavity with a wide or flared stripe so that it does not provide optical waveguiding in the lateral horizontal direction. The light diverges and the beam expands in the horizontal plane, although it is still guided in the vertical direction by the laser cladding layers. The laser's output mirror, which is only partially reflective, is then patterned by lithography to have a curved shape and forms a cylindrical mirror to focus or collimate the beam. This curved vertical laser cavity mirror can be etched or milled in the same way as a flat cavity mirror.

Figure 7:
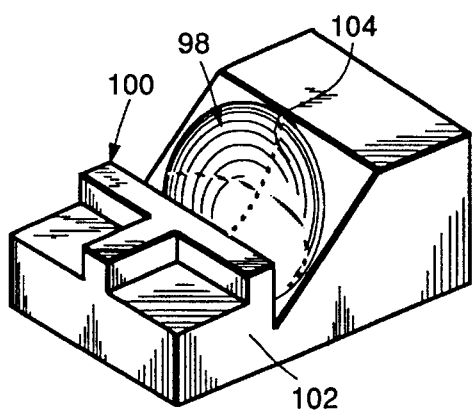
FIG. 7 is a perspective view of another laser-mirror embodiment with a mirror surface that has been processed with a focused ion beam.

Another approach to achieving a surface-emitting laser with a beam that is shaped in both directions, both parallel and perpendicular to the laser cavity, is illustrated in FIG. 7. An enlarged 45° turning mirror 98 is formed opposite a conventional laser 100 on a substrate 102. In this case, however, a flat rather than a curved mirror is etched during the ion beam milling step. A bowl-shaped recess 104 is then machined into the mirror surface, as described in co-pending application Ser. No. 07/971,383, "3-D Opto-Electronics System With Laser Inter-Substrate Communications, and Fabrication Method" filed Nov. 4, 1992 by Kubena et al., and assigned to Hughes Aircraft Company, the assignee of the present invention.

In each of the above embodiments, the expanded mirror area results in a larger f-number, increases the output efficiency, and yields a smoother beam pattern. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method of fabricating an in-line laser and turning mirror system from a substrate that includes an active lasing layer between a pair of cladding layers, comprising:

forming an etch mask over said substrate to expose an opening over an intended mirror position, including a mirror extension, directionally etching said substrate at a non-perpendicular angle to form a laser emitting surface in said active and cladding layers, and a turning mirror that faces said laser emitting surface, and controlling said etching to redeposit etched substrate material in the shadow of said etch mask to form an extension of said mirror that extends away from the substrate beyond the upper surface of said laser.

2. The method of claim 1, wherein said redeposited material is accumulated against an edge of said etch mask.

3. The method of claim 1, wherein said etching is performed by ion beam milling.

4. The method of claim 3, wherein said etch mask is formed as a photoresist with a height of about 5–10 microns prior to said ion beam milling.

5. The method of claim 4, wherein said etching also etches said photoresist down to a height of about 3–6 microns.

6. The method of claim 1, further comprising the step of removing said etch mask after etching said substrate.

7. A method of fabricating an in-line laser and turning mirror system from a substrate that includes an active lasing layer between upper and lower cladding layers, comprising:

forming a mirror extension layer over the upper cladding layer of said substrate, and forming an angled opening into said extension layer and said active and cladding layers to define the emitting edge of a laser and an opposed turning mirror base surface, with a beam emitted from said laser diverging to reach both substrate and extension portions of said mirror base surface, and further comprising the step of removing said extension layer from over said laser after the formation of said angled opening.

8. The method of claim 7, wherein said extension layer is removed from over said laser by applying a mask to said mirror while leaving at least a major portion of the extension layer over the laser exposed, etching away the extension layer from over the laser, and then removing the mask.

9. The method of claim 8, wherein said mask extends beyond the laser area over a portion of the extension layer, the extension being sufficient to protect the laser's emitting surface.

10. The method of claim 8, wherein an etch stop layer of a material that is resistant to an extension layer etchant is formed over said substrate below said extension layer for confining etching to the extension layer.

11. The method of claim 10, wherein said etch stop layer is removed from over the laser, after the etching of the extension layer from over the laser with said extension layer etchant, by etching the etch stop layer with a selective etchant that does not materially attack the underlying laser.

12. The method of claim 10, wherein the etch stop material is selected to have a refractive index similar to that of the substrate and extension layer, and thereby forms a portion of the mirror surface without substantially distorting the mirror's optical qualities.

* * * * *